(12) United States Patent
Heid et al.

(10) Patent No.: US 6,850,206 B2
(45) Date of Patent: Feb. 1, 2005

(54) LOCAL RADIO-FREQUENCY ANTENNA FOR A MAGNETIC RESONANCE APPARATUS

(75) Inventors: Oliver Heid, Gunzenhausen (DE); Markus Vester, Nuremberg (DE)

(73) Assignee: Siemens Atiengesellschaft, Münich (DE)

( * ) Notice: Subject to any disclaimer, the term of this patent is extended or adjusted under 35 U.S.C. 154(b) by 115 days.

(21) Appl. No.: 10/304,805

(22) Filed: Nov. 26, 2002

(65) Prior Publication Data

US 2003/0109783 A1 Jun. 12, 2003

(30) Foreign Application Priority Data

Dec. 7, 2001 (DE) .......................... 101 60 073

(51) Int. Cl.⁷ .......................... H01Q 1/00; A61B 5/055
(52) U.S. Cl. .................. 343/787; 600/421; 324/319; 324/318
(58) Field of Search .................. 343/787, 703, 343/788, 872; 600/421; 324/319, 318, 320, 322; H01Q 1/00; A61B 5/055

(56) References Cited

U.S. PATENT DOCUMENTS

| 5,111,146 A | | 5/1992 | Kuhn |
| 5,293,126 A | * | 3/1994 | Schaefer ...................... 324/318 |
| 5,304,933 A | * | 4/1994 | Vavrek et al. .............. 324/318 |
| 5,635,839 A | | 6/1997 | Srivastava et al. |
| 6,294,972 B1 | | 9/2001 | Jesmanowicz et al. |
| 6,509,735 B2 | * | 1/2003 | Mueller et al. ............. 324/307 |

FOREIGN PATENT DOCUMENTS

DE   OS 197 41 748   12/1998

* cited by examiner

*Primary Examiner*—Hoanganh Le
(74) *Attorney, Agent, or Firm*—Schiff Hardin LLP

(57) ABSTRACT

A local radio-frequency antenna for a magnetic resonance apparatus is fashioned for a region to be imaged in an edge region of and/or outside an imaging volume of the magnetic resonance apparatus, and the radio-frequency antenna has a passive shim device.

7 Claims, 2 Drawing Sheets

LOCAL RADIO-FREQUENCY ANTENNA FOR A MAGNETIC RESONANCE APPARATUS

BACKGROUND OF THE INVENTION

1. Field of the Invention

The present invention is directed to a local radio-frequency antenna for a magnetic resonance apparatus.

2. Description of the Prior Art

Magnetic resonance technology is a known technique for, among other things, acquiring images of the inside of the body of an examination subject. In a magnetic resonance apparatus, rapidly switched gradient fields that are generated by a gradient system are superimposed on a static, basic magnetic field that is generated by a basic field magnet system. The magnetic resonance apparatus also has a radio-frequency system that emits radio-frequency signals into the examination subject for triggering magnetic resonance signals, and picks up the generated magnetic resonance signals from which magnetic resonance images are produced.

The magnetic resonance apparatus has an imaging volume in which a region of the examination subject to be imaged is positioned for producing magnetic resonance images. Oriented at the transverse cross-section of maximum expanse of an average patient, many magnetic resonance apparatus have a spherical imaging volume with a diameter of approximately 40 cm. In typical applications, this imaging volume is rarely completely utilized at one time. The spatial expanse of the imaging volume and the degree of homogeneity of the basic magnetic field required therein determine the costs of the basic field magnet, and thus of the entire magnetic resonance apparatus to a considerable extent.

In magnetic resonance technology, a high homogeneity of the basic magnetic field is a decisive factor for the quality of the magnetic resonance images. Inhomogeneities of the basic magnetic field within the imaging volume cause geometrical distortions of the magnetic resonance image that are proportional to the inhomogeneities. Shim systems are utilized for improving the basic magnetic field homogeneity within the imaging volume. Passive shim systems and active shim systems are known.

In a passive shim system, a number of lamellae composed of a magnetic material, particularly a ferromagnetic iron alloy, are attached in a suitable arrangement in the examination space of the magnetic resonance apparatus. To that end, the basic magnetic field within the imaging volume is measured before the application of the lamellae. A computing program determines the suitable number and arrangement of the lamellae based on the measured values. U.S. Pat. No. 5,635,839 discloses a passive shim system for this purpose wherein shim boxes fittable with ferromagnetic lamellae are insertable into corresponding shim box receptacles of a gradient coil system of a magnetic resonance apparatus.

In active shim systems, shim coils that can be charged with direct currents are utilized for homogenizing the basic magnetic field. Among other things, an active shim system is employed for fine correction when extremely high homogeneity is required, for example in order to correct field distortions caused by the magnetic susceptibility of the examination subject at least partially disposed in the imaging volume.

It is also important for a high quality of magnetic resonance images that magnetic resonance signals be picked up be radio-frequency antennas of the radio-frequency system with a high signal-to-noise ratio. It is known to employ a radio-frequency antennas fashioned as a stationary antenna, referred to as a whole-body antenna, that can be utilized as a transmission antenna and as a reception antenna. Additionally, local radio-frequency antennas, referred to as local antennas, are utilized for improving the signal-to-noise ratio. These are antennas that are adapted to the size of a region to be imaged. For example, there are local antennas that are permanently installed in the support mechanism or that can be latched at fixed positions on the bearing mechanism, for example for examining a shoulder or a female breast. There are also freely movable local antennas, for example flexible antennas and extremity antennas. The local antenna can be fashioned as a pure reception antenna, with a whole-body antenna then being utilized as the transmission antenna.

Further, German OS 197 41 748 discloses a magnetic resonance apparatus wherein a shim coil is integrated in the housing of a local radio-frequency antenna.

SUMMARY OF THE INVENTION

An object of the present invention is to provide a device with which high-quality magnetic resonance images can also be acquired from a region to be imaged that projects beyond an imaging volume of a magnetic resonance apparatus.

This object is inventively achieved by a local radio-frequency antenna for a magnetic resonance apparatus, the radio-frequency antenna BEING fashioned for a region to be imaged in an edge region of and/or outside an imaging volume of the magnetic resonance apparatus, and wherein the radio-frequency antenna includes a passive shim device.

As a result of these inventive features, a high-quality magnetic resonance image can be acquired for the region to be imaged without the necessity of a magnetic resonance apparatus with a larger imaging volume having comparable homogeneity, which—at least for a basic field magnet—would involve considerable added outlay and thus added costs. This allows the construction of an economical magnetic resonance apparatus with a comparatively small imaging volume given utilization of the local radio-frequency antenna with passive shim device.

The local radio-frequency antenna can be utilized for regions to be imaged that, due to the geometry of the magnetic resonance apparatus and/or the physiognomy of the examination subject, cannot be positioned proximate to the center of the imaging volume.

DESCRIPTION OF THE PREFERRED EMBODIMENTS

Figure 1:
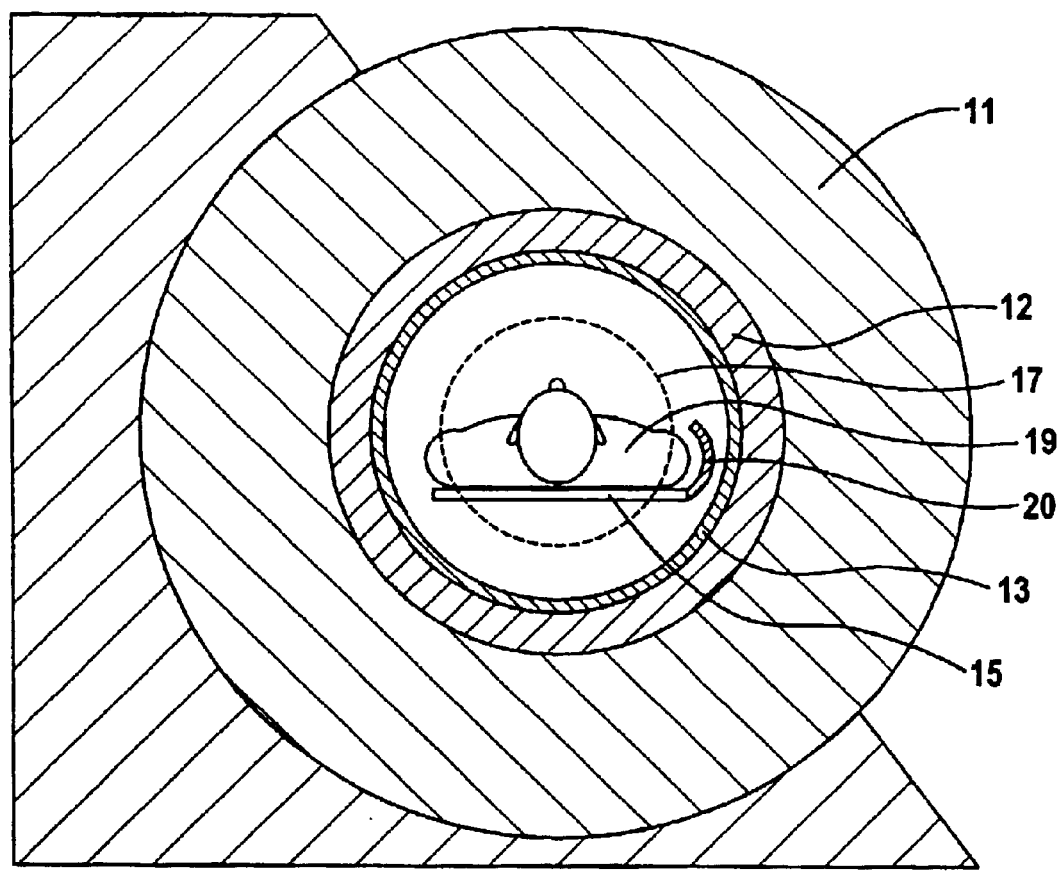
FIG. 1 is a cross-section through a magnetic resonance apparatus with a local antenna having a passive shim device in accordance with the invention

FIG. 1 shows a cross-section through a magnetic resonance apparatus as an exemplary embodiment of the invention. The magnetic resonance apparatus has a basic field magnet 11 for generating a static basic magnetic field. The generated basic magnetic field should be optimally homogeneous within an imaging volume 17 of the magnetic resonance apparatus. A residual inhomogeneity of the basic magnetic field within the spherical imaging volume 17 is indicated with a ppm value.

An essentially hollow-cylindrically fashioned gradient coil system 12 for generating gradient fields is permanently installed in a cavity of the essentially hollow-cylindrically fashioned basic field magnet 11. Passive and/or active shim systems can be integrated in the permanently installed gradient coil system 12.

An essentially hollow-cylindrical whole-body antenna 13 is permanently installed in a cavity of the gradient coil system 12. Radio-frequency signals can be radiated into an examination subject, for example the patient 19 placed in the cavity of the whole-body antenna 13, with the whole-body antenna 13, and the magnetic resonance signals triggered as a result thereof can be picked up therewith. Magnetic resonance images then are produced on the basis of these magnetic resonance signals. The cavity of the whole-body antenna 13 essentially forms a limitation of an examination space with the imaging volume 17 located therein. The magnetic resonance apparatus also has a displaceable support mechanism 15 that can be moved together with the patient 19 placed thereon in the examination space such that a region of the patient 19 to be imaged can be positioned in the imaging volume 17.

The magnetic resonance apparatus also has a rigidly fashioned local antenna 20 with a passive shim device. The local antenna 20 in this example is specifically fashioned for picking up magnetic resonance signals from a shoulder region of the patient 19. Further, the local antenna 20 is correspondingly fashioned for engagement or latching into the support mechanism 15.

Figure 2:
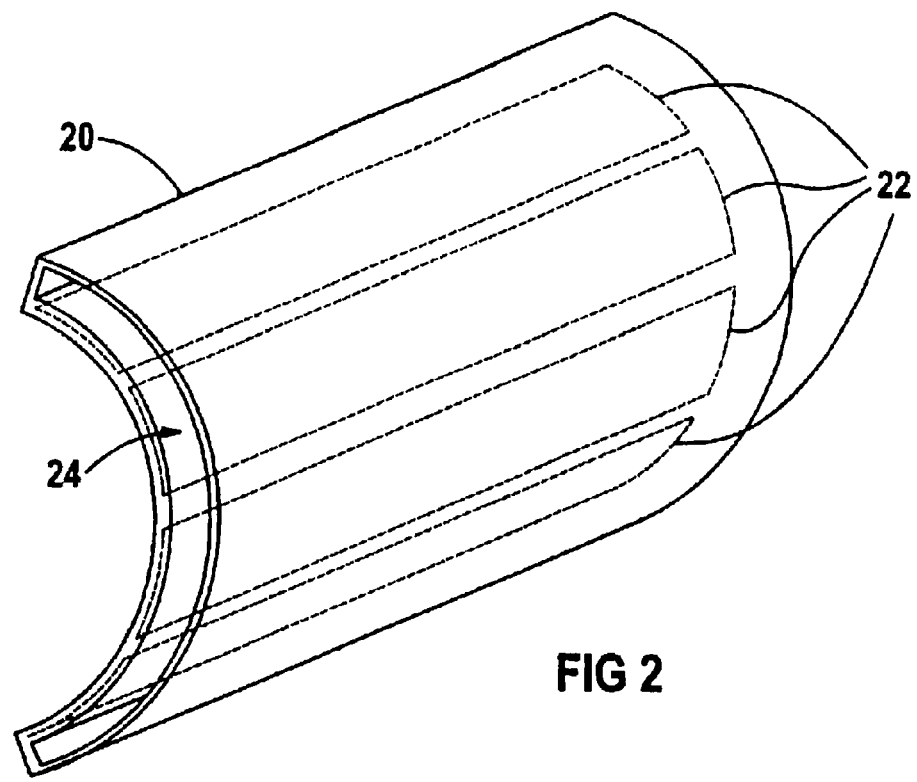
FIG. 2 is a perspective view of the inventive local antenna.

FIG. 2 shows a more detailed illustration of the local antenna 20 in a perspective view. The local antenna 20 has antenna conductors 22 (shown with broken lines) for picking up the magnetic resonance signals and a correspondingly fashioned receptacle frame 24 for receiving a carrier device 26 of the passive shim device that can be equipped with shim elements 28. The carrier device 26 able to be introduced into and withdrawn from the receptacle frame 24.

Figure 3:
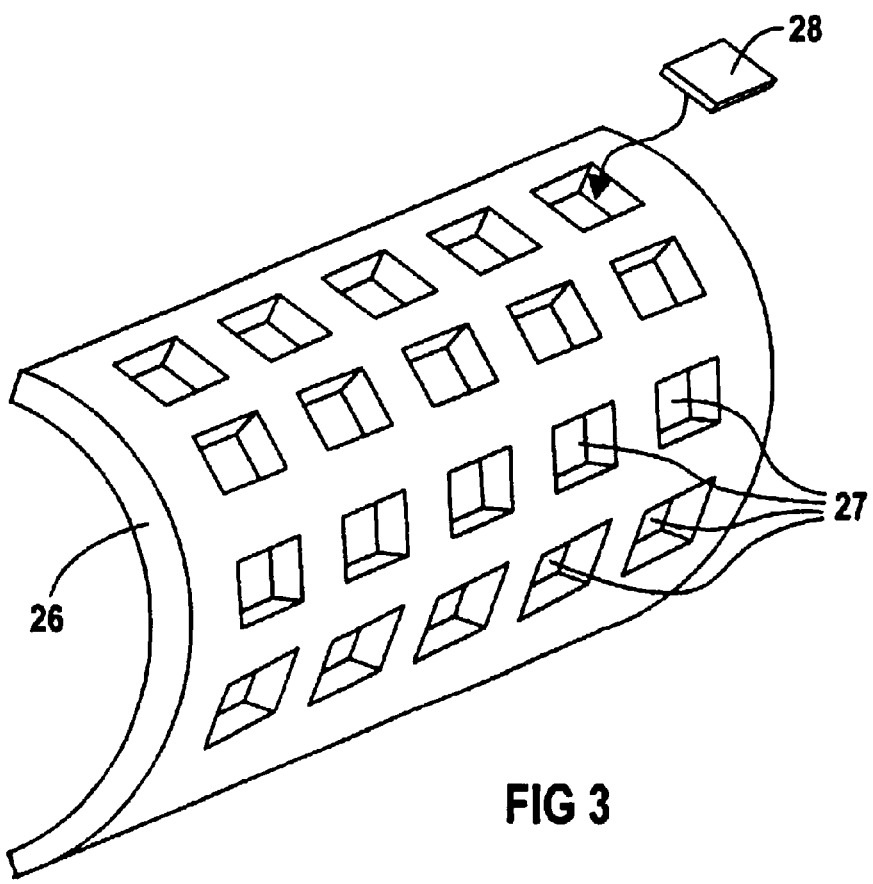
FIG. 3 is a perspective view of a carrier mechanism of the shim device of the inventive local antenna.

FIG. 3 shows the carrier device 26 in a perspective view. For receiving plate-shaped shim elements 28 of magnetic, particularly ferromagnetic material, the carrier device 26 has correspondingly fashioned depressions 27.

A high homogeneity of the basic magnetic field for the entire region to be imaged is achieved by the local antenna 20 with the integrated, passive shim device, even for the shoulder region of the patient 19 to be imaged that is located at the edge of and/or outside the imaging volume 17, so that high-quality magnetic resonance images also can be acquired from this region. Local antennas with passive shim device can be utilized particularly for a region of an examination subject to be imaged that, due to the geometry of the magnetic resonance apparatus and/or a physiognomy of the examination subject, cannot be positioned proximate to the center of the imaging volume 17.

The local antenna 20 with passive shim device can even be designed such that the shim device achieves a prescribable homogeneity of the basic magnetic field in the shoulder region to be imaged, and such that a corresponding degradation of the homogeneity is accepted outside of this imaged region, for example in the head of the patient 19.

The magnetic resonance apparatus is operated in an embodiment so that the support mechanism 15 is displaced such that, when the local antenna 15 is used, this assumes a permanently prescribable use location with respect to the imaging volume 17. As a result, the shim device of the local antenna can be equipped once with shim elements 28 adapted to what is always the same use location. The rigid fashioning of the local antenna 20 facilitates insertion at this location that is always the same use location. Given different use locations, in contrast, the local antenna 20 is equipped with the shim device suitably correspondingly adapted to the respective use location.

Although modifications and changes may be suggested by those skilled in the art, it is the intention of the inventors to embody within the patent warranted hereon all changes and modifications as reasonably and properly come within the scope of their contribution to the art.

We claim as our invention:

1. A local radio-frequency antenna for a magnetic resonance apparatus, said magnetic resonance apparatus having an imaging volume, defined by a spatial extent of a homogeneous basic magnetic field, said local radio-frequency antenna comprising:

a radio-frequency antenna structure disposed and shaped for obtaining signals from a volume encompassing space outside of said imaging volume; and a passive shim device physically supported by said antenna structure for shimming said volume encompassing space outside of said imaging volume.

2. The local radio-frequency antenna as claimed in claim 1 wherein said antenna structure forms a structural unit with said shim device.

3. The local radio-frequency antenna as claimed in claim 1 wherein said shim device comprises a carrier device and shim elements, composed of magnetic material, carried by said carrier device.

4. The local radio-frequency antenna as claimed in claim 3 wherein said antenna structure has a receptacle space, and wherein said carrier device is introducible into and withdrawable from said receptacle space.

5. The local radio-frequency antenna as claimed in claim 3 wherein said shim elements are composed of ferromagnetic material.

6. The local radio-frequency antenna as claimed in claim 1 wherein said antenna structure is adapted for use at a prescribed position relative to said imaging volume.

7. The A local radio-frequency antenna as claimed in claim 1 wherein said antenna structure is rigid.

* * * * *